United States Patent [19]
McClure

[11] Patent Number: 5,440,178
[45] Date of Patent: Aug. 8, 1995

[54] STATIC TEST MODE NOISE FILTER

[75] Inventor: David C. McClure, Carrollton, Tex.

[73] Assignee: SGS-Thomson Microelectronics, Inc., Carrollton, Tex.

[21] Appl. No.: 160,608

[22] Filed: Nov. 30, 1993

[51] Int. Cl.⁶ .......................... H03K 9/08; H03K 17/16
[52] U.S. Cl. ........................................ 327/34; 327/31; 327/379; 327/551
[58] Field of Search ................... 307/542, 542.1, 272.3, 307/543, 350, 362, 290, 572, 443, 234, 231; 327/310, 311, 313, 379, 383–386, 389, 391, 1, 31, 34, 36, 37, 142, 198, 551; 326/21

[56] References Cited

U.S. PATENT DOCUMENTS

| | | | |
|---|---|---|---|
| 4,471,235 | 9/1984 | Sakhuja et al. | 307/234 |
| 4,525,635 | 6/1985 | Gillberg | 307/234 |
| 5,109,163 | 4/1992 | Benhamida | 307/272.3 |
| 5,198,710 | 3/1993 | Houston | 307/234 |

FOREIGN PATENT DOCUMENTS

| | | | |
|---|---|---|---|
| 0063231 | 4/1983 | Japan | 307/272.3 |
| 0207712 | 12/1983 | Japan | 307/542.1 |
| 0029117 | 1/1990 | Japan | 307/272.3 |
| 0113621 | 4/1990 | Japan | 307/542.1 |
| 404077111 | 3/1992 | Japan | 307/542.1 |
| 405206795 | 8/1993 | Japan | 307/542.1 |

*Primary Examiner*—Timothy P. Callahan
*Assistant Examiner*—Toan Tran
*Attorney, Agent, or Firm*—Renee Michelle Larson; Lisa K. Jorgenson; Richard K. Robinson

[57] ABSTRACT

According to the present invention, a time filter prevents unintentional static entry into a test mode. Static entry is delayed an appropriate period of time after receipt of the required stimulus to enter the test mode. The delay period is chosen to be longer than transient conditions present in noisy operating environments such that static entry into the test mode is not accidentally triggered. Only when a super voltage condition is applied to an integrated circuit pin for the duration of a predetermined delay time can static entry to a test mode be accomplished. Exit from a test mode occurs immediately after the stimulus is removed. Delay circuitry of the present invention comprises a plurality of transistors, a schmitt trigger, and a delay element, and the delay circuitry determines the value of the predetermined voltage level and the predetermined delay time.

30 Claims, 1 Drawing Sheet

STATIC TEST MODE NOISE FILTER

BACKGROUND OF THE INVENTION

1. Field of the Invention

The present invention relates generally to integrated circuit testing, and more specifically to a time filter that delays static entry into an integrated circuit test mode.

2. Description of the Prior Art

Entry into a test mode or special operating modes for integrated circuits is often accomplished through either dynamic entry or static entry. Dynamic entry into a test mode is accomplished by clocking and latching the required test mode condition into the device being tested. The clocking and latching mechanism of dynamic entry offers the advantage of keeping all of the integrated circuit pins free for usage even after the test mode has been entered. However, a disadvantage of dynamic entry is that the test mode may be accidentally entered if the test mode condition is latched into the device when the test mode is not desired.

Static entry into a test mode is accomplished by supplying a static super voltage to one or more pins of the device being tested for the duration of the test mode. Static entry into a test mode is practical when it is not a requirement that all integrated circuit pins remain available for use during a test mode. For example, during a test mode where all the wordlines of a memory device are turned on, some, but not all, of the pins may be available for use. Additionally, entry into a parallel test mode where multiple words of data are accessed simultaneously speeds up testing and also frees up the use of some functional pins. However, a drawback of static test mode entry is that unintentional entry into a test mode can result from overshoots or undershoots on pins during normal operation in noisy systems.

In spite of the problems associated with static entry into a test mode, the difficulties apparent with dynamic entry into a test mode may be more problematic. Accidental dynamic entry into a test mode occurs as a result of clocking and then latching the required test mode condition into the device. This can also occur upon power up of the device. Because the test mode condition is latched in, it is difficult to exit a test mode once accidentally entered. On the other hand, accidental static entry into a test mode may be exited by simply removing the super voltage to the appropriate pins. The advantages of static entry make it desirable to determine a way to prevent unintentional static entry into a test mode.

SUMMARY OF THE INVENTION

It would be advantageous in the art to prevent unintentional static entry into an integrated circuit test mode caused by overshoots, undershoots, or other transient conditions present in noisy operating environments.

Therefore, according to the present invention, a time filter prevents accidental static entry into a test mode. Static entry is delayed an appropriate period of time after receipt of the required stimulus to enter the test mode. The delay period is chosen to be longer than transient conditions present in noisy operating environments such that static entry into the test mode is not accidentally triggered. Exit from the test mode happens immediately after the stimulus is removed.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing, wherein:

DESCRIPTION OF THE INVENTION

To prevent accidental static entry into a test mode caused by undershoots, overshoots, or other transient conditions introduced to integrated circuit pins by a noisy operating environment, a time filter for static entry into a test mode is described, according to the present invention. Static entry may be delayed an appropriate period of time after receipt of the required stimulus to enter the test mode. The delay period is chosen to be longer than these transient conditions such that static entry into the test mode is not accidentally triggered.

Figure 1:
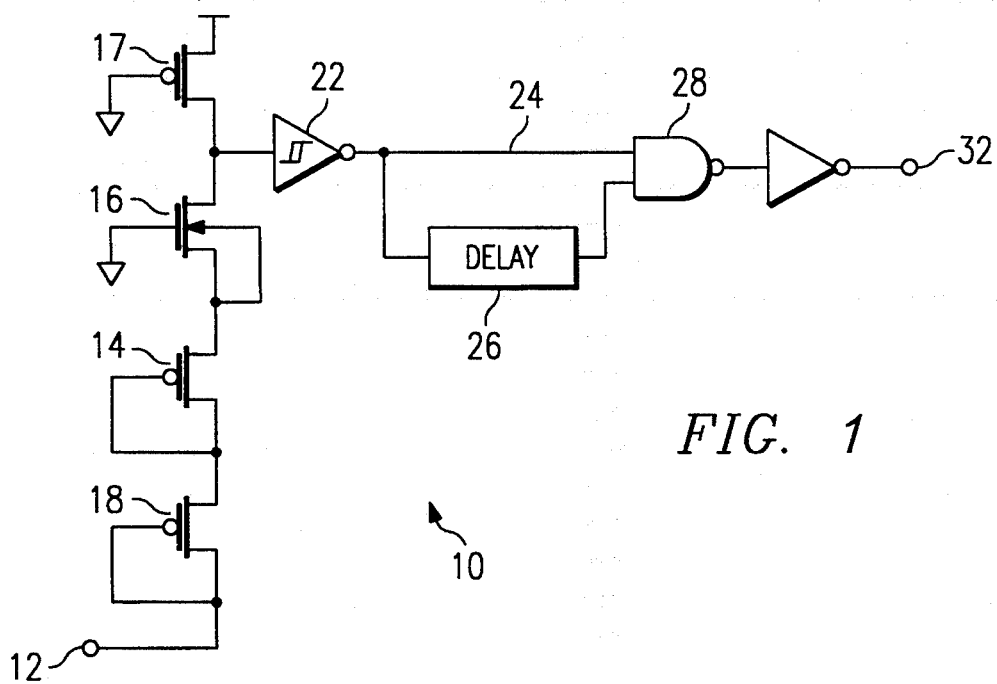
FIG. 1 is a schematic diagram of circuitry for introducing delays to static entry of a test mode, according to a first preferred embodiment of the present invention.

Referring to FIG. 1, a schematic diagram of circuitry 10 for delaying static entry into a test mode, according to the present invention, is shown. N-channel transistor 16 and p-channel transistors 14 and 18 are connected in series between integrated circuit pin 12 and p-channel load transistor 17 which is connected to the $V_{CC}$ power supply, as shown. The gate of n-channel transistor 16 is connected to ground and its source/drain is connected to the source/drain of p-channel transistor 14, which in turn is connected to the source/drain of p-channel transistor 18. Both p-channel transistors 14 and 18 are diode connected, meaning that the gate is connected to the source/drain. The order of the series connections between transistors 14, 16, and 18 is inconsequential; transistors 14, 16, and 18 may be connected in series in any order such that n-channel transistor 16 or p-channel transistor 14, rather than p-channel transistor 18, may be directly connected to integrated circuit pin 12. Additionally, any number of p-channel transistors may be connected in the series path between p-channel load transistor 17 and integrated circuit pin 12.

To enter a test mode, a negative static super voltage is applied to integrated circuit pin 12. When the super voltage applied to integrated circuit pin 12 is pulled below a predetermined voltage level represented by (VTN+ |NVTP| +ΔV) volts below ground potential, the output signal 24 of schmitt trigger 22, which operates as a detector element, goes to a high logic level; VTN is the threshold voltage of n-channel transistor 16, NVTP is the threshold voltage of N p-channel transistors, in this case N is equal to 2, and ΔV is the voltage required to get below the voltage trip point of schmitt trigger 22. Varying the number of p-channel transistors used changes the value of NVTP in the above equation, thereby allowing the value of the predetermined voltage level to be changed by changing the number of p-channel transistors used. The predetermined voltage level may be equal to approximately −3 volts, for instance.

Test mode output signal 32 is gated by logic NAND gate 28 which has output signal 24 and the output signal of delay element 26 as input signals, and thus test mode output signal 32 will not go to a high logic level until the delay represented by delay element 26 is traversed. The delay introduced by delay element 26 may vary, but should be of a longer duration than transient noise, such as undershoots and overshoots, to which integrated circuit pin 12 may be subjected. For memory devices, the delay will be approximately greater than 10 nS, and may typically vary from approximately 20 nS to 50 nS. Thus, when the delay represented by delay element 26 has been traversed and the super voltage applied to pin 12 has not risen above the predetermined voltage level for the duration of the delay time, then test mode output signal 32 goes to a logic high level and the test mode is entered.

After the test mode has thus been legitimately entered, it will be exited at any time the super voltage is not maintained below the predetermined voltage level. Thus, when the super voltage applied to integrated circuit pin 12 goes above the predetermined voltage level, test mode output signal 32 goes to a logic low state and the test mode is exited immediately. Additionally, if the super voltage applied to integrated circuit pin 12 rises above the predetermined voltage level before the delay of delay element 26 has been traversed, test mode output signal 32 will go to a logic low level and the test mode will not be entered. This would be the desired result if overshoots or undershoots were present on integrated circuit pin 12. Also, when test mode output signal 32 goes to a logic low level, for instance upon exiting the test mode, circuitry 10 will be reset such that any subsequent time integrated circuit pin 12 goes below the predetermined voltage level, the entire delay time of delay element 26 must be traversed before the test mode is entered. This prevents subsequent undershoots and overshoots from triggering false entry into the test mode. There are a number of well known circuits which could be used to reset the circuitry 10 (and in particular delay element 26) and thus are not described here.

Figure 2:
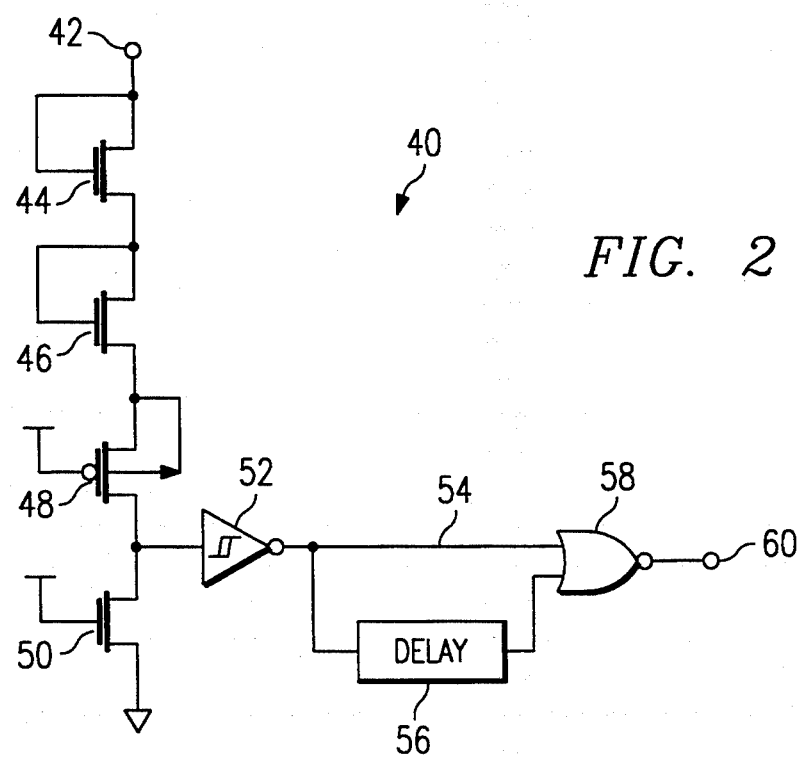
FIG. 2 is a schematic diagram of circuitry for introducing delays to static entry of a test mode, according to a second preferred embodiment of the present invention.

Referring to FIG. 2, a second preferred embodiment of the present invention is shown. Circuitry 40 is similar to circuitry 10 of FIG. 1 in that it also delays static entry into a test mode. However, circuitry 40 is designed to accept a positive super voltage rather than a negative super voltage on pin 42.

N-channel transistors 44 and 46 and p-channel transistor 48 are connected in series between integrated circuit pin 42 and n-channel load transistor 50, which is connected to the $V_{SS}$ power supply, as shown. The gate of p-channel transistor 48 is connected to $V_{CC}$ and its source/drain is connected to the source/drain of n-channel transistor 46, which in turn is connected to the source/drain of n-channel transistor 44. Both n-channel transistors 44 and 46 are diode connected, meaning that the gate is connected to the source/drain. As in FIG. 1, the order of the series connections between transistors 44, 46, and 48 is inconsequential; they may be connected in series in any order such that n-channel transistor 46 or p-channel transistor 48, rather than n-channel transistor 44, may be directly connected to integrated circuit pin 42. Additionally, any number of n-channel transistors may be connected in the series path between n-channel load transistor 50 and integrated circuit pin 42.

To enter a test mode, a positive static super voltage is applied to integrated circuit pin 42. When the super voltage applied to integrated circuit pin 42 is pulled above a predetermined voltage level represented by $VCC + |VTP| + |NVTN| + \Delta V$ volts, the output signal 54 of schmitt trigger 52, which operates as a detector element, goes to a low logic level; VCC is the positive supply voltage, VTP is the threshold voltage of p-channel transistor 48, NVTN is the threshold voltage of N n-channel transistors, in this case N is equal to 2, and $\Delta V$ is the voltage required to get above the voltage trip point of schmitt trigger 22. Varying the number of n-channel transistors used changes the value of NVTN in the above equation, thereby allowing the value of the predetermined voltage level to be changed by changing the number of n-channel transistors used. The predetermined voltage level may be equal to approximately +3 volts, for instance.

Test mode output signal 60 is gated by logic NOR gate 58 which has output signal 54 and the output signal of delay element 56 as input signals, and thus test mode output signal 60 will not go to a high logic level until the delay represented by delay element 56 is traversed. The delay introduced by delay element 56 may vary, but should be of a longer duration than transient noise, such as undershoots and overshoots, to which integrated circuit pin 42 may be subjected. Thus, when the delay represented by delay element 56 has been traversed and the super voltage applied to pin 42 has not fallen below the predetermined voltage level for the duration of the delay time, then test mode output signal 60 goes to a logic high level and the test mode is entered. If, at any time after the test mode has been entered, the super voltage on integrated circuit pin 42 falls below the predetermined voltage level, the test mode will be exited immediately. Also, when test mode output signal 60 goes to a logic low level, for instance upon exiting the test mode, circuitry 40 will be reset (and in particular delay element 56) such that any subsequent time integrated circuit pin 42 goes above the predetermined voltage level, the entire delay time of delay element 56 must be traversed before the test mode is entered. This prevents subsequent undershoots and overshoots from triggering false entry into the test mode.

The circuitry 10 and circuitry 40 of FIGS. 1 and 2, respectively, has been described for one pin, integrated circuit pin 12 and integrated circuit pin 42. However, the present invention applies to one or more pins of an integrated circuit, and thus circuitry 10 and 40 may be duplicated for any number of integrated circuit pins that will be supplied a super voltage in order to initiate static entry into a test mode.

Static entry into a test mode offers the advantages of being simpler to implement and easier to escape unintentional entry into a test mode than dynamic entry. The present invention makes it possible to enjoy the advantages of static entry into a test mode even during operation in a noisy system. Also, the present invention allows for a smaller super voltage to be applied to integrated circuit pins, because accidental entry into a test mode is filtered out based on time duration as well as the value of the super voltage supplied.

While the invention has been particularly shown and described with reference to a preferred embodiment, it will be understood by those skilled in the art that various changes in form and detail may be made therein without departing from the spirit and scope of the invention. For instance, schmitt triggers 22 and 52 of FIG. 1 and FIG. 2, respectively, may be replaced with other types of detector elements such as inverters.

What is claimed is:

1. Circuitry to delay static entry into a test mode, comprising:

an integrated circuit pin;

a super voltage which is applied to the integrated circuit pin when static entry into a test mode is desired; and delay circuitry which allows static entry into the test mode after a predetermined delay time if the super voltage applied to the integrated circuit pin stays below a predetermined threshold voltage level for the duration of the predetermined delay time and which allows immediate exit from the test mode, bypassing the predetermined delay time, when the super voltage on the integrated circuit pin rises above the predetermined threshold voltage, causing the delay circuitry to be reset such that subsequent static entry into the test mode occurs only after the super voltage applied to the integrated circuit pin stays below the predetermined threshold voltage for the duration of the predetermined delay time;

wherein the delay circuitry comprises a plurality of transistors connected in series between a load device connected to a first power supply and the integrated circuit pin; a detector element, which has an output signal, connected to the load device; a delay element, which has an output signal and introduces a delay equal to the predetermined delay time, connected to the output signal of the detector element; a logic gate which has a first input signal equal to the output signal of the detector element, a second input signal equal to the output signal of the delay element, and a test mode output signal.

2. The circuitry of claim 1, wherein the plurality of transistors are comprised of a n-channel transistor, whose gate is connected to a second supply voltage, and at least one diode connected p-channel transistor.

3. The circuitry of claim 2, wherein the predetermined threshold voltage level is equal to $-(VTN+|NVTP|+\Delta V)$ volts, where VTN is equal to the threshold voltage of the n-channel transistor, NVTP is equal to the threshold voltage of N diode connected p-channel transistors, and $\Delta V$ is equal to the threshold voltage of the detector element.

4. The circuitry of claim 3, wherein a source/drain of the n-channel transistor is connected to the load device, and said at least one diode connected p-channel transistor includes a first diode connected p-channel transistor which is connected to the n-channel transistor and a second diode connected p-channel transistor which is connected to the first diode connected p-channel transistor and the integrated circuit pin, and wherein the predetermined threshold voltage level is equal to $-(VTN+|2VTP|+\Delta V)$ volts.

5. The circuitry of claim 4, wherein the predetermined threshold voltage level is equal to approximately $-3$ volts.

6. The circuitry of claim 1, wherein the detector element is a schmitt trigger element.

7. The circuitry of claim 1, wherein the load element is a p-channel transistor.

8. The circuitry of claim 1, wherein the predetermined delay time is greater than approximately 10 nS.

9. Circuitry to delay static entry into a test mode, comprising:

an integrated circuit pin;

a super voltage which is applied to the integrated circuit pin when static entry into a test mode is desired; and delay circuitry which allows static entry into the test mode after a predetermined delay time if the super voltage applied to the integrated circuit pin stays above a predetermined threshold voltage for the duration of the predetermined delay time and which allows immediate exit from the test mode, bypassing the predetermined delay time, when the super voltage on the integrated circuit pin falls below the predetermined threshold voltage level, causing the delay circuitry to be reset such that subsequent static entry into the test mode occurs only after the super voltage applied to the integrated circuit pin stays above the predetermined threshold voltage for the duration of the predetermined delay time;

wherein the delay circuitry comprises a plurality of transistors connected in series between a load device connected to a first power supply and the integrated circuit pin; a detector element, which has an output signal, connected to the load device; a delay element, which has an output signal and introduces a delay equal to the predetermined delay time, connected to the output signal of the detector element; a logic gate which has a first input signal equal to the output signal of the detector element, a second input signal equal to the output signal of the delay element, and a test mode output signal.

10. The circuitry of claim 9, wherein the plurality of transistors are comprised of a p-channel transistor, whose gate is connected to a second supply voltage, and at least one diode connected n-channel transistor.

11. The circuitry of claim 10, wherein the predetermined threshold voltage level is equal to $(VCC+|VTP|+NVTN+\Delta V)$ volts, where VCC is equal to the second supply voltage, VTP is equal to the threshold voltage of the p-channel transistor, NVTN is equal to the threshold voltage of N diode connected n-channel transistors, and $\Delta V$ is equal to the threshold voltage of the detector element.

12. The circuitry of claim 11, wherein a source/drain of the p-channel transistor is connected to the load device, and said at least one diode connected n-channel transistor includes a first diode connected n-channel transistor which is connected to the p-channel transistor and a second diode connected n-channel transistor which is connected to the first diode connected n-channel transistor and the integrated circuit pin, and wherein the predetermined threshold voltage level is equal to $(VCC+|VTP|+2VTN+\Delta V)$ volts.

13. The circuitry of claim 12, wherein the predetermined threshold voltage level is equal to approximately 3 volts above VCC.

14. The circuitry of claim 9, wherein the detector element is a schmitt trigger element.

15. The circuitry of claim 9, wherein the load element is a n-channel transistor.

16. A method for delaying static entry into a test mode, comprising the steps of:

applying a super voltage to an integrated circuit pin;

traversing a predetermined delay time determined by delay circuitry;

entering a test mode if the super voltage applied to the integrated circuit pin stays below a predetermined threshold voltage level for the duration of the predetermined delay time; and immediately exiting the test mode, by bypassing the predetermined delay time, and resetting the delay circuitry when the super voltage on the integrated circuit pin rises above the predetermined threshold voltage, such that subsequent static entry into the test mode occurs only after the super voltage applied to the integrated circuit pin stays below the predetermined threshold voltage for the duration of the predetermined delay time;

wherein the delay circuitry comprises a plurality of transistors connected in series between a load device connected to a first power supply and the integrated circuit pin; a detector element, which has an output signal, connected to the load device; a delay element, which has an output signal and introduces a delay equal to the predetermined delay time, connected to the output signal of the detector element; a logic gate which has a first input signal equal to the output signal of the detector element, a second input signal equal to the output signal of the delay element, and a test mode output signal.

17. The circuitry of claim 16, wherein the plurality of transistors are comprised of a n-channel transistor, whose gate is connected to a second supply voltage, and at least one diode connected p-channel transistor.

18. The circuitry of claim 17, wherein the predetermined threshold voltage level is equal to $-(VTN+|NVTP|+\Delta V)$ volts, where VTN is equal to the threshold voltage of the n-channel transistor, NVTP is equal to the threshold voltage of N diode connected p-channel transistors, and $\Delta V$ is equal to the threshold voltage of the detector element.

19. The circuitry of claim 18, wherein a source/drain of the n-channel transistor is connected to the load device, and said at least one diode connected p-channel transistor includes a first diode connected p-channel transistor which is connected to the n-channel transistor and a second diode connected p-channel transistor which is connected to the first diode connected p-channel transistor and the integrated circuit pin, and wherein the predetermined threshold voltage level is equal to $-(VTN+|2VTP|+\Delta V)$ volts.

20. The circuitry of claim 19, wherein the predetermined threshold voltage level is equal to approximately $-3$ volts.

21. The circuitry of claim 16, wherein the detector element is a schmitt trigger element.

22. The circuitry of claim 16, wherein the load element is a p-channel transistor.

23. The circuitry of claim 16, wherein the predetermined delay time is greater than approximately 10 nS.

24. A method for delaying static entry into a test mode, comprising the steps of:

applying a super voltage to an integrated circuit pin;

traversing a predetermined delay time determined by delay circuitry;

entering a test mode if the super voltage applied to the integrated circuit pin stays above a predetermined threshold voltage level for the duration of the predetermined delay time; and immediately exiting the test mode, by bypassing the predetermined delay time, and resetting the delay circuitry when the super voltage on the integrated circuit pin falls below the predetermined threshold voltage, such that subsequent static entry into the test mode occurs only after the super voltage applied to the integrated circuit pin stays above the predetermined threshold voltage for the duration of the predetermined delay time;

wherein the delay circuitry comprises a plurality of transistors connected in series between a load device connected to a first power supply and the integrated circuit pin; a detector element, which has an output signal, connected to the load device; a delay element, which has an output signal and introduces a delay equal to the predetermined delay time, connected to the output signal of the detector element; a logic gate which has a first input signal equal to the output signal of the detector element, a second input signal equal to the output signal of the delay element, and a test mode output signal.

25. The circuitry of claim 24, wherein the plurality of transistors are comprised of a p-channel transistor, whose gate is connected to a second supply voltage, and at least one diode connected n-channel transistor.

26. The circuitry of claim 25, wherein the predetermined threshold voltage level is equal to $(VCC+|VTP|+NVTN+\Delta V)$ volts, where VCC is equal to the second supply voltage, VTP is equal to the threshold voltage of the p-channel transistor, NVTN is equal to the threshold voltage of N diode connected n-channel transistors, and $\Delta V$ is equal to the threshold voltage of the detector element.

27. The circuitry of claim 26, wherein a source/drain of the p-channel transistor is connected to the load device, and said at least one diode connected n-channel transistor includes a first diode connected n-channel transistor which is connected to the p-channel transistor and a second diode connected n-channel transistor which is connected to the first diode connected n-channel transistor and the integrated circuit pin, and wherein the predetermined threshold voltage level is equal to $(VCC+|VTP|+2VTN+\Delta V)$ volts.

28. The circuitry of claim 27, wherein the predetermined threshold voltage level is equal to approximately 3 volts above VCC.

29. The circuitry of claim 24, wherein the detector element is a schmitt trigger element.

30. The circuitry of claim 24, wherein the load element is a n-channel transistor.

* * * * *